US009882057B2

(12) United States Patent
Tian

(10) Patent No.: US 9,882,057 B2
(45) Date of Patent: Jan. 30, 2018

(54) LOW TEMPERATURE POLY-SILICON THIN FILM TRANSISTOR AND MANUFACTURING METHOD THEREOF, ARRAY SUBSTRATE AND DISPLAY DEVICE

(71) Applicant: BOE TECHNOLOGY GROUP CO., LTD., Beijing (CN)

(72) Inventor: Hui Tian, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 14/435,538

(22) PCT Filed: Aug. 7, 2014

(86) PCT No.: PCT/CN2014/083917
§ 371 (c)(1),
(2) Date: Apr. 14, 2015

(87) PCT Pub. No.: WO2015/165164
PCT Pub. Date: Nov. 5, 2015

(65) Prior Publication Data
US 2016/0133755 A1  May 12, 2016

(30) Foreign Application Priority Data
Apr. 30, 2014  (CN) .......................... 2014 1 0182783

(51) Int. Cl.
H01L 27/14  (2006.01)
H01L 29/786  (2006.01)
(Continued)

(52) U.S. Cl.
CPC .... H01L 29/78675 (2013.01); H01L 21/0262 (2013.01); H01L 21/02274 (2013.01);
(Continued)

(58) Field of Classification Search
CPC ........ H01L 21/02274; H01L 21/02532; H01L 21/02592; H01L 21/0262; H01L 21/02667;
(Continued)

(56) References Cited

U.S. PATENT DOCUMENTS 5,424,230 A * 6/1995 Wakai ................. H01L 21/2022
148/DIG. 1
5,534,445 A * 7/1996 Tran .................... H01L 21/3003
257/E21.212
(Continued)

FOREIGN PATENT DOCUMENTS

CN  1276630 A  12/2000
CN  1588645 A  3/2005
(Continued)

OTHER PUBLICATIONS

International Search Report and Written Opinion of the International Searching Authority with Notice of Transmittal of the International Search Report and Written Opinion of PCT/CN2014/083917 in Chinese, dated Aug. 7, 2014.
(Continued)

Primary Examiner — Mohammed Shamsuzzaman
(74) Attorney, Agent, or Firm — Collard & Roe, P.C.

(57) ABSTRACT

A low temperature poly-silicon thin film transistor and its manufacturing method, an array substrate and a display device are provided. The method comprises: forming a poly-silicon film on a base substrate (1) and patterning the poly-silicon film to form an active layer (3); forming a gate insulation layer (4) on the active layer (3) and performing hydrogenation process to the gate insulation layer (4) and the active layer (3). By this method, the diffusion distance of hydrogen is largely shortened, the time for the hydrogena-
(Continued)

tion process is reduced, and thus the process cost for the thin film transistor is largely lowered down.

8 Claims, 3 Drawing Sheets

(51) Int. Cl.
| | |
|---|---|
| H01L 21/02 | (2006.01) |
| H01L 21/265 | (2006.01) |
| H01L 21/266 | (2006.01) |
| H01L 21/28 | (2006.01) |
| H01L 21/30 | (2006.01) |
| H01L 27/12 | (2006.01) |
| H01L 29/66 | (2006.01) |

(52) U.S. Cl.
CPC .. *H01L 21/02532* (2013.01); *H01L 21/02592* (2013.01); *H01L 21/02667* (2013.01); *H01L 21/02675* (2013.01); *H01L 21/266* (2013.01); *H01L 21/26513* (2013.01); *H01L 21/28158* (2013.01); *H01L 21/3003* (2013.01); *H01L 27/1222* (2013.01); *H01L 27/1274* (2013.01); *H01L 29/66757* (2013.01); *H01L 29/786* (2013.01)

(58) Field of Classification Search
CPC ......... H01L 21/02675; H01L 21/26513; H01L 21/266; H01L 21/28158; H01L 21/3003; H01L 21/324; H01L 27/1222; H01L 27/1274; H01L 29/66757; H01L 29/786; H01L 29/78675
USPC ...... 257/72, 66, 64; 438/474, 151, 149, 162, 438/765, 471, 166; 427/527
See application file for complete search history.

(56) References Cited

U.S. PATENT DOCUMENTS

| | | | | |
|---|---|---|---|---|
| 5,744,202 | A * | 4/1998 | Nickel | ................ H01L 21/3003 257/E21.212 |
| 7,026,226 | B1 | 4/2006 | Lin | |
| 7,199,063 | B2 * | 4/2007 | Lin | ...................... H01L 21/314 257/E21.266 |
| 7,368,751 | B2 * | 5/2008 | Young | ............... H01L 29/66757 257/66 |
| 7,785,947 | B2 | 8/2010 | Isobe et al. | |
| 2002/0006711 | A1 * | 1/2002 | Yamazaki | ......... H01L 29/66757 438/471 |
| 2004/0238820 | A1 | 12/2004 | Sakama et al. | |
| 2005/0202601 | A1 * | 9/2005 | Koide | ............... H01L 29/78621 438/149 |
| 2005/0282316 | A1 * | 12/2005 | Young | ............... H01L 29/66757 438/149 |
| 2006/0030084 | A1 * | 2/2006 | Young | ................ H01L 27/1214 438/149 |
| 2006/0094211 | A1 * | 5/2006 | Lin | ..................... H01L 21/3003 438/474 |
| 2007/0161165 | A1 * | 7/2007 | Liu | ................... H01L 29/66757 438/151 |

FOREIGN PATENT DOCUMENTS

| | | |
|---|---|---|
| CN | 1685488 A | 10/2005 |
| CN | 1855399 A | 11/2006 |
| CN | 101000927 A | 7/2007 |
| CN | 101724901 A | 6/2010 |
| CN | 102629558 A | 8/2012 |
| JP | 2012089878 A | 5/2012 |

OTHER PUBLICATIONS

Chinese Office Action in Chinese Application No. 201410182783.X dated Mar. 29, 2016 with English translation.
International Search Report and Written Opinion of the International Searching Authority with Notice of Transmittal of the International Search Report and Written Opinion of PCT/CN2014/083917 in Chinese, dated Jan. 20, 2015 with English translation.

* cited by examiner

LOW TEMPERATURE POLY-SILICON THIN FILM TRANSISTOR AND MANUFACTURING METHOD THEREOF, ARRAY SUBSTRATE AND DISPLAY DEVICE

CROSS REFERENCE TO RELATED APPLICATIONS

This application is the National Stage of PCT/CN2014/083917 filed on Aug. 7, 2014, which claims priority under 35 U.S.C. § 119 of Chinese Application No. 201410182783.X filed on Apr. 30, 2014, the disclosure of which is incorporated by reference.

TECHNICAL FIELD

At least one embodiment of the present invention relates to a low temperature poly-silicon (LTPS) thin film transistor and its manufacturing method, an array substrate and a display device.

BACKGROUND

Low temperature poly-silicon thin film transistors (TFT) have been widely used in various kinds of displays, such as Active Matrix Organic Light Emitting Diode, Active Matrix Liquid Crystal Display, and so on due to the advantages such as high mobility, stability, or the like.

A TFT used in the above-mentioned type of the display is generally prepared as follows. A layer of poly-silicon film is formed on a base substrate, and is patterned to form an active layer of the thin film transistor; a gate insulation layer is formed on the active layer; a gate electrode is formed on the gate insulation layer; then ions are implanted into the active layer to form a source electrode area and a drain electrode area, respectively; an interlayer dielectric layer is deposited to cover the gate electrode and the gate insulation layer; contact holes leading to the source electrode area and the drain electrode area are formed; and then a metal layer is formed and patterned to form a source electrode and a drain electrode electrically connected to the source electrode area and the drain electrode area through the contact holes, respectively. In the above manufacturing process for the TFT, dangling bonds having unbonded orbitals are generated at the interface between the poly-silicon film and the gate insulation layer, which is an important factor to increase the density of interface state at the grain boundary of the poly-silicon. Due to the influence of the dangling bonds, the display device is suffered from performance degradation, for example, the carrier mobility of the thin film transistor is reduced, and the threshold voltage is raised, and so on.

In order to provide hydrogen to the dangling bonds so as to make the dangling bonds passive at the interface between the poly-silicon film and the gate insulation layer, the most common hydrogenation method is conducted as follows: after the thin film transistor is completely formed, that is, after the metal layer is formed, performing anneal in hydrogen atmosphere to diffuse hydrogen to the gate insulation layer and the poly-silicon layer. Another common method is to use a silicon nitride film of the interlayer dielectric layer as the source of hydrogen and perform thermal treatment onto the thin film transistor.

DETAILED DISCLOSURE

At least one embodiment of the present invention provides a low temperature poly-silicon thin film transistor and its manufacturing method, an array substrate and a display device, by which the time for hydrogenation process in manufacturing the thin film transistor is shortened, and thus the process cost of the thin film transistor is lowered down.

Firstly, at least one embodiment of the present invention provides a method for manufacturing a low temperature poly-silicon thin film transistor including: forming a poly-silicon film on a base substrate, and patterning the poly-silicon film to form an active layer; and forming a gate insulation layer on the active layer and hydrogenating the gate insulation layer and the active layer.

At least one embodiment of the present invention also relates to the low temperature poly-silicon thin film transistor made by the above method for manufacturing a low temperature poly-silicon thin film transistor.

At least one embodiment also relates to an array substrate including the above low temperature poly-silicon thin film transistor.

At least one embodiment of the present invention also relates to a display device including the above thin film transistor or the above array substrate.

DESCRIPTION OF ACCOMPANYING DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

REFERENCE NUMERALS

1—base substrate; 2—buffer layer; 3—active layer; 4—gate insulation layer; 5—gate electrode; 6—source electrode area; 7—drain electrode area; 8—interlayer dielectric layer; 9—source electrode; 10—drain electrode

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

The inventors of the present invention have noted that in the method in which an anneal process is performed in hydrogen atmosphere to diffuse hydrogen into the gate insulation layer and the poly-silicon layer after the completion of the metal layer and in the method in which the silicon nitride film of the interlayer dielectric layer is used as the source of hydrogen to perform thermal treatment onto the TFT, generally, hydrogen has to penetrate many layers of films and into the active layer, which makes the diffuse distance of hydrogen longer. Therefore, in order to sufficiently perform hydrogenation, it is necessary to perform the thermal treatment for a longer time period, which increases the time and cost for the process. Meantime, with a long time thermal treatment, there would be heat impact on the components of the TFT, and thus results in degradation of the electrical performance of the TFT, and especially for the TFT with a large size, the impact would be greater.

In order to solve the problem that the time spent for performing hydrogenation during manufacturing of a thin film transistor is long, at least one embodiment of the present invention provides a low temperature poly-silicon thin film transistor and its manufacturing method, an array substrate and a display device.

In the technical solution of the embodiment of the present invention, after the gate insulation layer is completed, hydrogenation is performed directly onto the gate insulation layer and the active layer, and hydrogen needs to penetrate the gate insulation layer only to arrive at the interface between the gate insulation layer and the active layer to make the dangling bonds passive, which largely shortens the diffusion distance of hydrogen, and reduces the time for the hydrogenation process and hence largely lowers down the process cost of the thin film transistor.

In order to make the object, technical solution and advantages of the present invention more clear, hereinafter the present invention will be described in further detail by way of embodiments.

Figure 1:
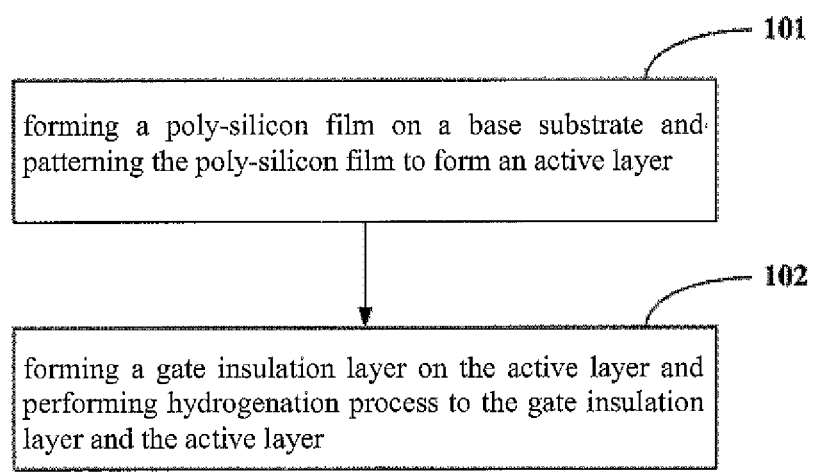
FIG. 1 is a flow chart for illustrating the method for manufacturing a low temperature poly-silicon thin film transistor as provided by an embodiment of the present invention.

At least one embodiment of the present invention, firstly, provides a method for manufacturing a low temperature poly-silicon thin film transistor, as shown in FIG. 1. FIG. 1 shows the flow chart of the method for manufacturing a low temperature poly-silicon thin film transistor provided by an embodiment of the present invention, the method includes the following steps:

Step 101, forming a poly-silicon film on a base substrate and patterning the poly-silicon film to form an active layer; and Step 102, forming a gate insulation layer on the active layer, and performing hydrogenation process to the gate insulation layer and the active layer.

In the above embodiment of the present invention, after formation of the gate insulation layer is completed, the hydrogenation process is directly performed to the gate insulation layer and the active layer, at this time, hydrogen needs to penetrate the gate insulation layer only and arrives at the interface between the gate insulation layer and the active layer, to make the dangling bonds passive and repair defects at the grain boundary of the active layer, by which the diffusion distance of the hydrogen is largely shortened, the time for the hydrogenation process is reduced, and thus the process cost for the thin film transistor is largely lowered down.

In the manufacturing method of the above embodiment, for example, performing the hydrogenation process to the gate insulation layer and the active layer includes performing the hydrogenation process to the gate insulation layer and the active layer by using nitrogen-hydrogen mixture plasma at the temperature condition of 260 to 400° C.

In a different embodiment, during the above hydrogenation process is preformed by using plasma at a certain temperature condition, the temperature may be lowered up to 260° C., and may be high up to 400° C., and may also be 280° C., 350° C. or 380° C. The temperature in a range from 260 to 400° C. is suitable for hydrogen to penetrate the gate insulation layer and into the surface of the poly-silicon, and the temperature is not so high as to influence the thin film transistor, thus the yield rate of the product is improved. The nitrogen-hydrogen mixture plasma may provide nitrogen plasma and hydrogen plasma of high reaction activity, is more easily combined with unsaturated silicon dangling bonds at the interface between the gate insulation layer and the active layer to form relatively stable Si—N bonds and Si—H bonds, by which the density of the interface state can be effectively lowered down and the characteristics of the interface can be improved, better hydrogenation effect can be achieved, compared with the annealing process in only hydrogen atmosphere, and the overall electrical performance of the display device can be effectively improved.

In different embodiments, the ratio of nitrogen to hydrogen in the nitrogen-hydrogen mixture plasma is not limited, for example, the ratio of nitrogen to hydrogen may be 1 to 1:10, for instance, when the ratio of nitrogen to hydrogen is 1:3 (for example, at this time the nitrogen-hydrogen mixture plasma is ammonia plasma), not only better hydrogenation effect can be achieved, but also the plasma can be easily prepared.

For example, forming the gate insulation layer on the active layer and performing a hydrogenation process to the gate insulation layer and the active layer may include: depositing the gate insulation layer on the active layer in a plasma enhanced chemical vapor deposition apparatus; and performing an anneal process on the deposited gate insulation layer, and during the anneal process on the deposited gate insulation layer, the hydrogenation process being performed to the gate insulation layer and the active layer.

The plasma enhanced chemical vapor deposition method is to ionize gas including atoms composing the film by means of microwave, radio frequency, or the like to locally form plasma. The plasma generated in the method has strong chemical activity, can easily invoke reaction, and can deposits a desired film on the based substrate. In order to enable the reaction at a lower temperature, the reaction is facilitated by the activity of the plasma; It is necessary to perform the anneal process on the gate insulation layer which has been deposited by using plasma, and a certain temperature is also needed to perform the hydrogenation process to the gate insulation layer and the active layer. Therefore, during the anneal process on the deposited gate insulation layer, the hydrogenation process is performed to the gate insulation layer and the active layer, by which hydrogen can be quickly diffused to the interface with the active layer to make the interface passive and repair the defects in the grain boundary of the active layer, the diffusion distance of the hydrogen can be largely shortened, and hence the time for the hydrogenation process can be largely shortened.

In an embodiment, the above method for manufacturing a low temperature poly-silicon thin film transistor may further include: forming a gate metal layer on the gate insulation layer, and patterning the gate metal layer to form a gate electrode; implanting ions to the active layer with the gate electrode as a mask to form a source electrode area and a drain electrode area; forming an interlayer dielectric layer covering the gate electrode and the gate insulation layer; patterning the interlayer dielectric layer and the gate insulation layer to form contact holes over the source electrode area and the drain electrode area; and forming a source/drain metal layer on the interlayer dielectric layer and patterning the source/drain metal layer to form a source electrode and a drain electrode, the source electrode and the drain electrode being electrically connected with the source electrode area and the drain electrode area through the contact holes, respectively.

In the above steps, after the hydrogenation process, then the steps for forming the gate electrode, the source electrode and the drain electrode are performed. The gate electrode, the source electrode and the drain electrode may be a single metal layer, and the material for these electrodes may be molybdenum (Mo), aluminum (Al), titanium (Ti); or may be a composite layer composed of molybdenum, aluminum and titanium. The ion species for the ion implantation may be boron (B) ion or phosphorus (P) ion, and there is no limitation in the present invention.

In an embodiment, forming a poly-silicon film on a base substrate may include forming an amorphous silicon film on the base substrate, and performing solid phase crystallization or excimer laser annealing to the amorphous silicon film to form a poly-silicon film.

In an embodiment, before forming the amorphous silicon film on the base substrate, the method may further include: forming a buffer layer on the base substrate. For example, the material for the buffer layer may be a composite film composed of silicon oxide and silicon nitride.

In an embodiment, the amorphous silicon film and the buffer layer can be respectively formed by plasma enhanced chemical vapor deposition.

Hereinafter, by way of an embodiment, the method for manufacturing a low temperature thin film transistor according to the present invention will be described, but the present invention is not limited thereto.

Figure 2:
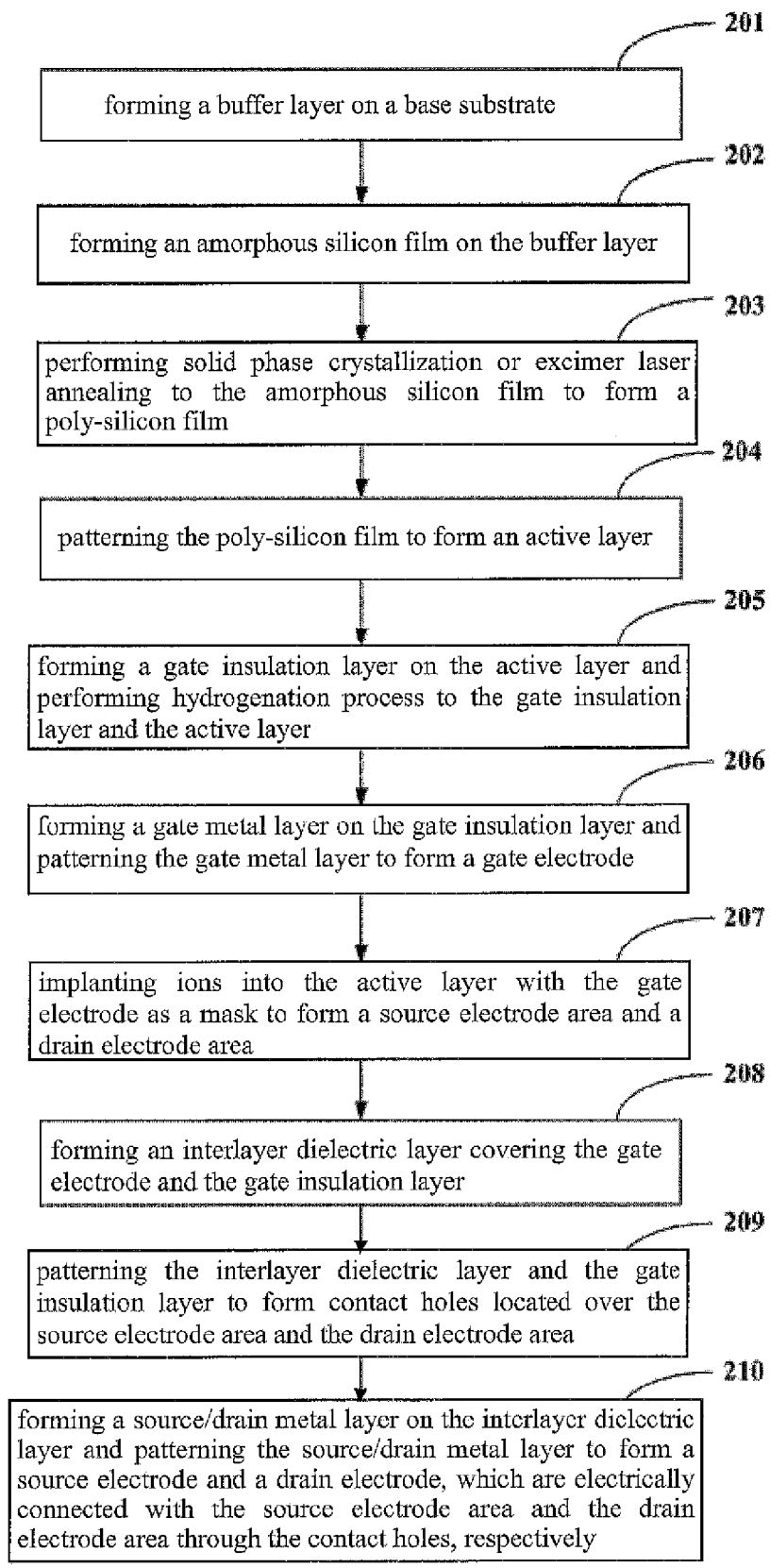
FIG. 2 is a flow chart for illustrating the method for manufacturing a low temperature poly-silicon thin film transistor according to another embodiment of the present invention.

As shown in FIG. 2 which is a flow chart for illustrating the method for manufacturing a low temperature thin film transistor according to an embodiment of the present invention, the manufacturing method includes the following steps:

Step 210: forming a buffer layer on a base substrate. For example, the base substrate may be a glass base substrate or of other material suitable to manufacturing a substrate for a TFT, the buffer layer can be formed by PECVD method, and can be a composite film composed of silicon oxide and silicon nitride.

Step 202, forming an amorphous silicon film on the buffer layer. For example, the amorphous silicon film can be formed by a PECVD method.

Step 203, performing solid phase crystallization or excimer laser annealing to the amorphous silicon film to form the poly-silicon film.

Step 204, patterning the poly-silicon film to form an active layer.

Step 205, forming a gate insulation layer on the active layer and performing hydrogenation process to the gate insulation layer and the active layer. This step can be performed in a PECVD apparatus, after the gate insulation layer has been deposited, during the annealing process is performed on the gate insulation layer, the hydrogenation process can be performed to the gate insulation layer and the active layer by using e.g. ammonia plasma, that is, the step of depositing the gate insulation layer and the step of hydrogenation process can be performed continuously without any time interval; the hydrogenation process is performed under the condition of 260 to 400° C.

Step 206, forming a gate metal layer on the gate insulation layer, and patterning the gate metal layer to form a gate electrode. For example, the material for the gate electrode may be metal, such as molybdenum (Mo), aluminum (Al), titanium (Ti).

Step 207, implanting ions into the active layer with the gate electrode as a mask to form a source electrode area and a drain electrode area. For example, the ions to be used may be boron or phosphorus ions.

Step 208, forming an interlayer dielectric layer covering the gate electrode and the gate insulation layer. For example, the interlayer dielectric layer can be formed by using silicon oxide or silicon nitride.

Step 209, patterning the interlayer dielectric layer and the gate insulation layer to form contact holes over the source electrode area and the drain electrode area. For example, the contact holes can be formed by a patterning and etching process.

Step 210, forming a source/drain metal layer on the interlayer dielectric layer and patterning the source/drain metal layer to form a source electrode and a drain electrode, the source electrode and the drain electrode being electrically connected with the source electrode area and the drain electrode area through the contact holes.

In the above embodiment of the present invention, after the manufacture of the gate insulation layer is completed, the hydrogenation process is performed directly to the gate insulation layer and the active layer, at this time, hydrogen needs to penetrate the gate insulation layer only and arrives at the interface between the gate insulation layer and the active layer to make the dangling bonds passive and repair the defects in the grain boundary of the active layer, by which the diffusion distance of the hydrogen is largely shortened, the time for the hydrogenation is reduced, and the process cost of the thin film transistor is largely lowered down.

Figure 3:
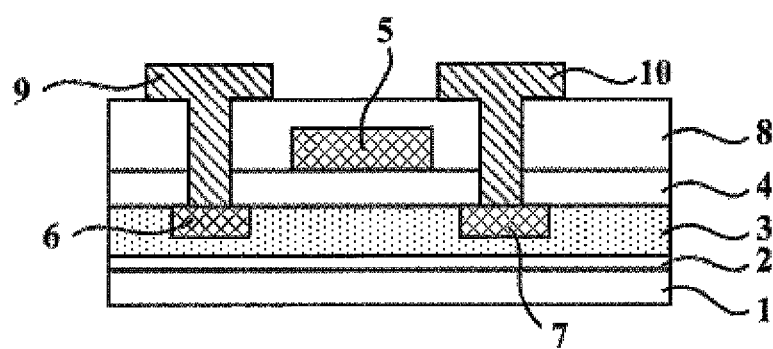
FIG. 3 is a schematic diagram for illustrating the structure of the low temperature poly-silicon thin film transistor made by an embodiment of the present invention.

The structure of the thin film transistor formed by the above embodiment is shown in FIG. 3. FIG. 3 is a schematic structural diagram of the low temperature poly-silicon thin film transistor made by the embodiment of the present invention. The thin film transistor comprises: a base substrate 1; a buffer layer 2 located on the base substrate 1; an active layer 3 located on the buffer layer 2; a source electrode area 6 and a drain electrode area 7 formed in the active layer 3; a gate insulation layer 4 on the active layer 3; a gate electrode 5 located on the gate insulation layer 4; an interlayer dielectric layer 8 covering the gate electrode 5 and the gate insulation layer 4; and a source electrode 9 and a drain electrode 10 respectively electrically connected with the source electrode area 6 and the drain electrode area 7 through contact holes. Compared with the method in which the hydrogenation process is performed after the TFT is completed (the temperature for the hydrogenation process is 350 to 420° C., and the time this process is 60 to 120 minutes), the temperature for the hydrogenation process is only 260 to 400° C. in the embodiments of the present invention, and the time is only 5 to 30 minutes. This is because the hydrogenation process is directly performed just after the gate insulation layer 4 is completed in the embodiments of the present invention, thus the diffusion distance of the hydrogen is shortened, which largely reduce the time for the hydrogenation process. Moreover, during the hydrogenation process, ammonia plasma is used, which provides nitrogen plasma and hydrogen plasma which have high reaction activity and are easier to combine with the unsaturated Si dangling bonds at the interface between the active layer and the insulation layer to form relatively stable Si—N bonds and Si—H bonds, it is possible to reduce the density of the interface state and improve the characteristics of the interface, achieve better hydrogenation effect than that provided by using only hydrogen, and effectively improve the overall electrical performance of the display device.

At least one embodiment of the present invention further relates to the low temperature poly-silicon thin film transistor made by any one of the above methods for manufacturing a low temperature poly-silicon thin film transistor. Since the hydrogenation process of the low temperature thin film transistor reduces the process cost, the cost of the low temperature poly-silicon thin film transistor is also lowered down.

At least one embodiment of the present invention also relates to an array substrate. In this array substrate, gate lines are intersected with date lines to define pixel units arranged in an array, each of the pixel units includes the thin film transistor according to the embodiments of the present invention as switch member. For example, the thin film transistor is formed by any one of the above methods for manufacturing a low temperature poly-silicon thin film transistor. For example, the array substrate can be used as an array substrate in OLED, electronic paper or LCD.

At least one embodiment of the present invention also relates to a display device comprising the above thin film transistor or the above array substrate which are made by any one of the above methods for manufacturing a low temperature poly-silicon thin film transistor. The display device, for example, can be a liquid crystal panel, an electronic paper, an OLED panel, a liquid crystal television, a liquid crystal monitor, a digital photo frame, a mobile phone, a tablet computer, or any product or components having any display function. The display device for example can be an active driving OLED or a passive driving LCD.

It is apparent to the person skilled in the art that various modification and variation can be made to the present invention without departing from the spirit and scope of the present invention. Thus, it is intended to include these modification and variation in the present invention if these modification and variation falls within the scope defined by the claims and its equivalents.

The present application claims the priority of Chinese Patent Application No. 201410182783.X filed on Apr. 30, 2014, the Chinese Patent Application is entirely incorporated therein as a part of the present application by reference.

What is claimed is:

1. A method for manufacturing a poly-silicon thin film transistor comprising:
    forming a poly-silicon film on a base substrate and patterning the poly-silicon film to form an active layer;
    forming a gate insulation layer on the active layer,
    wherein after the formation of the gate insulation layer, the method further comprises:
    simultaneously performing an annealing process and an hydrogenation process directly to the gate insulation layer and the active layer by using nitrogen-hydrogen mixture plasma at a temperature condition of 260° C. to 400° C.;
    wherein the nitrogen-hydrogen mixture plasma is only ammonia plasma which has a ratio of nitrogen to hydrogen of 1:3;
    wherein depositing the gate insulation layer and the hydrogenation process are performed continuously without any time interval in a plasma enhanced chemical vapor deposition apparatus.

2. The method for manufacturing a poly-silicon thin film transistor as claimed in claim 1, further comprising:
    forming a gate metal layer on the gate insulation layer and patterning the gate metal layer to form a gate electrode;
    implanting ions into the active layer with the gate electrode as a mask to form a source electrode area and a drain electrode area;
    forming an interlayer dielectric layer covering the gate electrode and the gate insulation gate;
    patterning the interlayer dielectric layer and the gate insulation layer to form contact holes located over the source electrode area and the drain electrode area; and
    forming a source/drain metal layer on the interlayer dielectric layer, and patterning the source/drain metal layer to form a source electrode and a drain electrode, the source electrode and the drain electrode being electrically connected with the source electrode area and the drain electrode area through the contact holes, respectively.

3. The method for manufacturing a poly-silicon thin film transistor as claimed in claim 1, wherein:
    an amorphous silicon film is formed on the base substrate;
    the amorphous silicon film is subjected from solid phase crystallization or excimer laser annealing to form the poly-silicon thin film.

4. The method for manufacturing a poly-silicon thin film transistor as claimed in claim 3, before the step of forming the amorphous silicon film on the base substrate, further comprising forming a buffer layer on the base substrate.

5. The method for manufacturing a poly-silicon thin film transistor as claimed in claim 4, wherein the amorphous silicon film and the buffer layer are respectively formed by plasma enhanced chemical vapor deposition.

6. A poly-silicon thin film transistor formed by using the method for manufacturing a poly-silicon thin film transistor as claimed in claim 1.

7. An array substrate comprising the poly-silicon thin film transistor as claimed in claim 6.

8. A display device comprising the thin film transistor as claimed in claim 6 or the array substrate as claimed in claim 7.

* * * * *